United States Patent
Guan et al.

(10) Patent No.: US 8,170,522 B2
(45) Date of Patent: May 1, 2012

(54) MULTI-TRANSFORMER ARCHITECTURE FOR AN ACTIVE RF CIRCUIT

(75) Inventors: Xiang Guan, Mountain View, CA (US); Chinh Huy Doan, Santa Clara, CA (US); Sohrab Emami-Neyestanak, San Francisco, CA (US)

(73) Assignee: SiBeam, Inc., Sunnyvale, CA (US)

( * ) Notice: Subject to any disclaimer, the term of this patent is extended or adjusted under 35 U.S.C. 154(b) by 1116 days.

(21) Appl. No.: 11/938,126

(22) Filed: Nov. 9, 2007

(65) Prior Publication Data
US 2008/0113643 A1  May 15, 2008

Related U.S. Application Data

(60) Provisional application No. 60/859,397, filed on Nov. 15, 2006.

(51) Int. Cl.
*H04B 1/26* (2006.01)
(52) U.S. Cl. ......... 455/330; 455/326; 455/333; 455/327
(58) Field of Classification Search ............... 455/326, 455/330, 333, 327
See application file for complete search history.

(56) References Cited

U.S. PATENT DOCUMENTS

| | | | | |
|---|---|---|---|---|
| 4,662,000 A | * | 4/1987 | Tajima et al. | 455/333 |
| 5,136,720 A | * | 8/1992 | Titus et al. | 455/323 |
| 5,428,839 A | * | 6/1995 | Friesen et al. | 455/326 |
| 5,787,126 A | * | 7/1998 | Itoh et al. | 375/340 |
| 6,026,287 A | * | 2/2000 | Puechberty et al. | 455/333 |
| 6,064,872 A | * | 5/2000 | Vice | 455/326 |
| 2003/0197575 A1 | | 10/2003 | Rofougaran et al. | |
| 2007/0037528 A1 | | 2/2007 | Doan et al. | |

FOREIGN PATENT DOCUMENTS

| | | |
|---|---|---|
| EP | 1578014 A1 | 9/2005 |
| EP | 1643584 A1 | 4/2006 |

OTHER PUBLICATIONS

"Applications for SiBEAM's WirelessHD Compliant Products", SiBEAM, Inc., Jul. 2006, (pp. 1-10).
"Balanced Line", Wikipedia, (last modified Oct. 9, 2007), Wikipedia Foundation, Inc., Internet reference at http://en.wikipedia.org/wiki/Balanced_Line, (3 pages).
"Balun", Wikipedia, (last modified Oct. 11, 2007), Wikipedia Foundation, Inc., Internet reference at http://en.wikipedia.org/wiki/Balun, (4 pages).
"Microstrip", Wikipedia, (last modified Oct. 12, 2007), Wikipedia Foundation, Inc., Internet reference at http://en.wikipedia.org/wiki/Microstrip, (4 pages).

(Continued)

*Primary Examiner* — Temesgh Ghebretinsae
*Assistant Examiner* — Richard Chan
(74) *Attorney, Agent, or Firm* — Blakely, Sokoloff, Taylor & Zafman LLP

(57) ABSTRACT

A circuit features a balun having an unbalanced input and a balanced output, and a differential coupler having a symmetrical structure about a center axis. The differential coupler has a differential input and a differential output, the differential input being coupled to the balanced output of the balun. An impedance element is coupled to a circuit node of the differential coupler at a point along the center axis. Other embodiments are also described and claimed.

30 Claims, 6 Drawing Sheets

OTHER PUBLICATIONS

"Radio Frequency", Wikipedia, (last modified Oct. 5, 2007), Wikipedia Foundation, Inc., Internet reference at http://en.wikipedia.org/wiki/Radio_frequency, (1 page).
"Stripline", Wikipedia, (last modified Jul. 16, 2007), Wikipedia Foundation, Inc., Internet reference at http://en.wikipedia.org/wiki/Sripline, (1 page).
"The CMOS Advantage", SiBEAM, Inc., Nov. 2005, (4 pages).
"Transformer", Wikipedia, (last modified Oct. 25, 2007), Wikipedia Foundation, Inc., Internet reference at http://en.wikipedia.org/wiki/Transformer, (14 pages).
Brodersen, Robert W., "Gigabit Rates Represent Future of Wireless", Electronic Engineering, EE Times, Design Currents, CMP United Business Media (Nov. 28, 2005) www.eet.com, (2 pages).
Caetano, Lianne, et al., "Benefits of 60 GHz—Right Frequency, Right Time", SiBEAM, Inc., Nov. 2005, (5 pages).
Vandersteen, Gerd, et al., "Broadband High Frequency Differential Coupler", IEEE Instrumentation and Measurement, Technology Conference, Budapest, Hungary, May 21-23, 2001, (pp. 1897-1902).
PCT International Search Report (dated Apr. 24, 2008), International Application No. PCT/US2007/023808—International Filing Date Nov. 14, 2007, (15 pages).
European Office Action for corresponding European Office Patent Application No. 07861974.9, Mar. 21, 2011, 6 pgs.

* cited by examiner

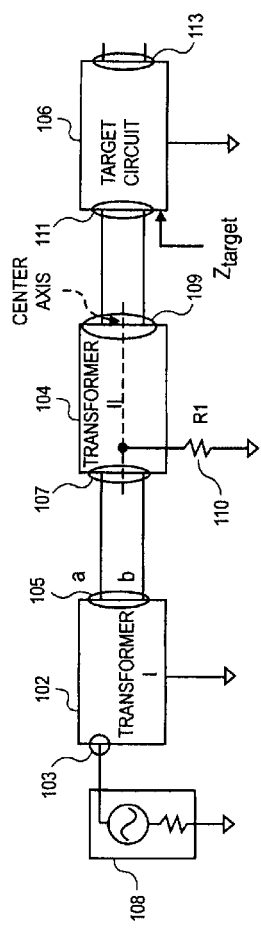
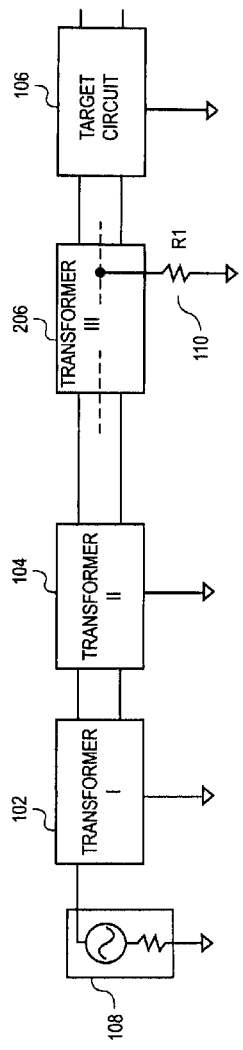
FIG. 1
FIG. 2

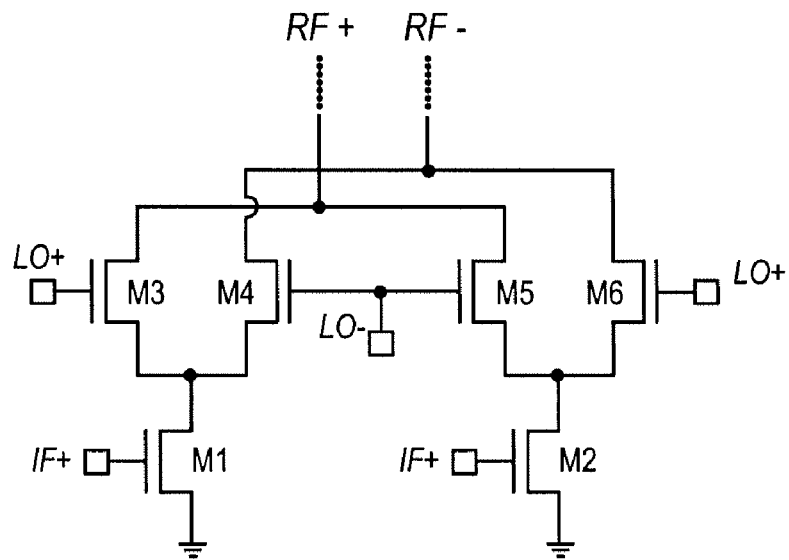
FIG. 6
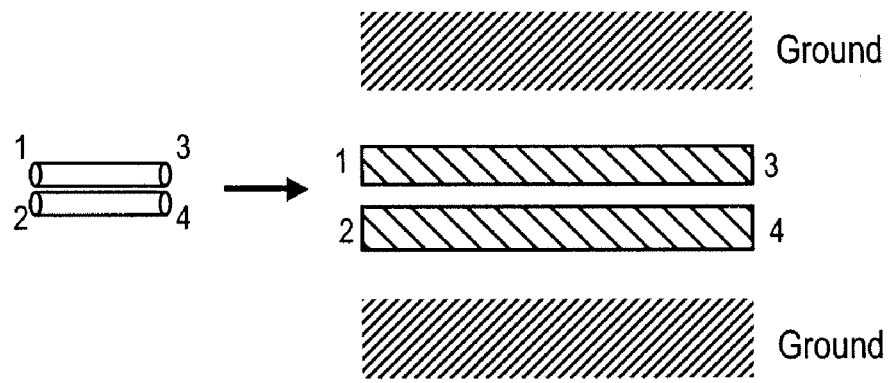
FIG. 7 Top View
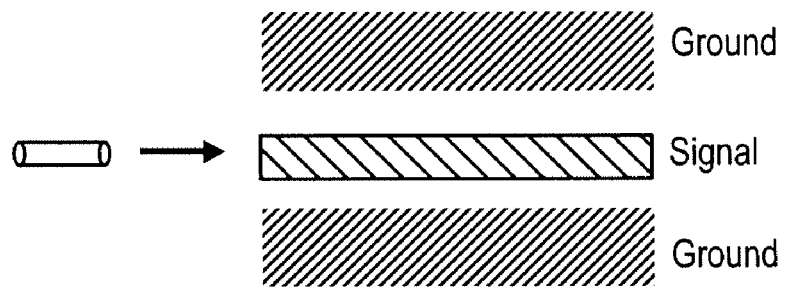
FIG. 8 Top View

MULTI-TRANSFORMER ARCHITECTURE FOR AN ACTIVE RF CIRCUIT

This application claims the benefit of the earlier filing date of U.S. Provisional Application Ser. No. 60/859,397 filed Nov. 15, 2006, entitled "Dual-Transformer Architecture for Improving Common-Mode Stability of a Millimeter-Wave Differential Mixer".

BACKGROUND

An embodiment of the invention is directed to a transformer architecture coupled to a port of a radio frequency (RF) active circuit to improve common stability.

Active RF circuits such as amplifiers and mixers often have a balanced (or differential) input stage. In that case, the input signal has two components, which are simultaneously applied to two similar terminals of the input stage, respectively. The active circuit in effect operates upon the difference between the two components, which tends to inherently cancel any noise signals that are essentially identical in phase and amplitude and that appear simultaneously on both terminals. This is referred to as common mode noise. The balanced input stage allows the active circuit to reduce the impact of common mode noise present at the input.

When an active RF circuit that has a differential input is to be driven by a single-ended source, a passive transformer referred to as a balun is used, to convert the single-ended signal (unbalanced) into a differential one (balanced). If the frequencies of operation are sufficiently high, such as in the microwave region and beyond, this arrangement may create a resonance that produces an undesired, common mode oscillation at the input to the active circuit. For instance, consider a mixer in a balanced configuration, which may have a balanced input port, a balanced output port, and a balanced local oscillator (LO) port. If the LO port has no differential signal applied to it, then that port should not exhibit any substantial signal. However in many cases, and particularly where the mixer is designed to operate with LO differential signals at 30 GHz or higher, a pair of essentially similar oscillatory signals appear on the respective input terminals of the LO port spontaneously. This is referred to as common mode oscillation.

SUMMARY

An embodiment of the invention is directed to a transformer architecture that may improve common mode stability of a target circuit by suppressing common mode oscillation at a port of the target circuit. A first transformer has an unbalanced input and a balanced output. A second transformer has a balanced input coupled to the balanced output of the first transformer. The second transformer has a symmetrical structure about a center axis to provide its balanced input and a balanced output. The target circuit has a balanced input coupled to the balanced output of the second transformer. In one embodiment, an impedance element is coupled to a circuit node of the second transformer at a point along the center axis. The impedance element has a resistive component that is selected to be greater than the absolute value of a negative resistive component of input impedance of the target circuit over a frequency range of interest. Other embodiments are also described.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

FIG. 1 is a block diagram of a circuit with dual transformers with a stabilizing impedance element coupled to the second transformer, at a balanced input of a target circuit.

FIG. 2 is a block diagram of a circuit with triple transformers at the balanced input of the target circuit.

FIG. 6 is a circuit schematic of a Gilbert-type up conversion mixer implemented using insulated gate field effect transistors.

FIG. 7 is a schematic diagram of a coplanar waveguide coupled line.

FIG. 8 is a schematic diagram of a coplanar waveguide transmission line.

DETAILED DESCRIPTION

Figure 3:
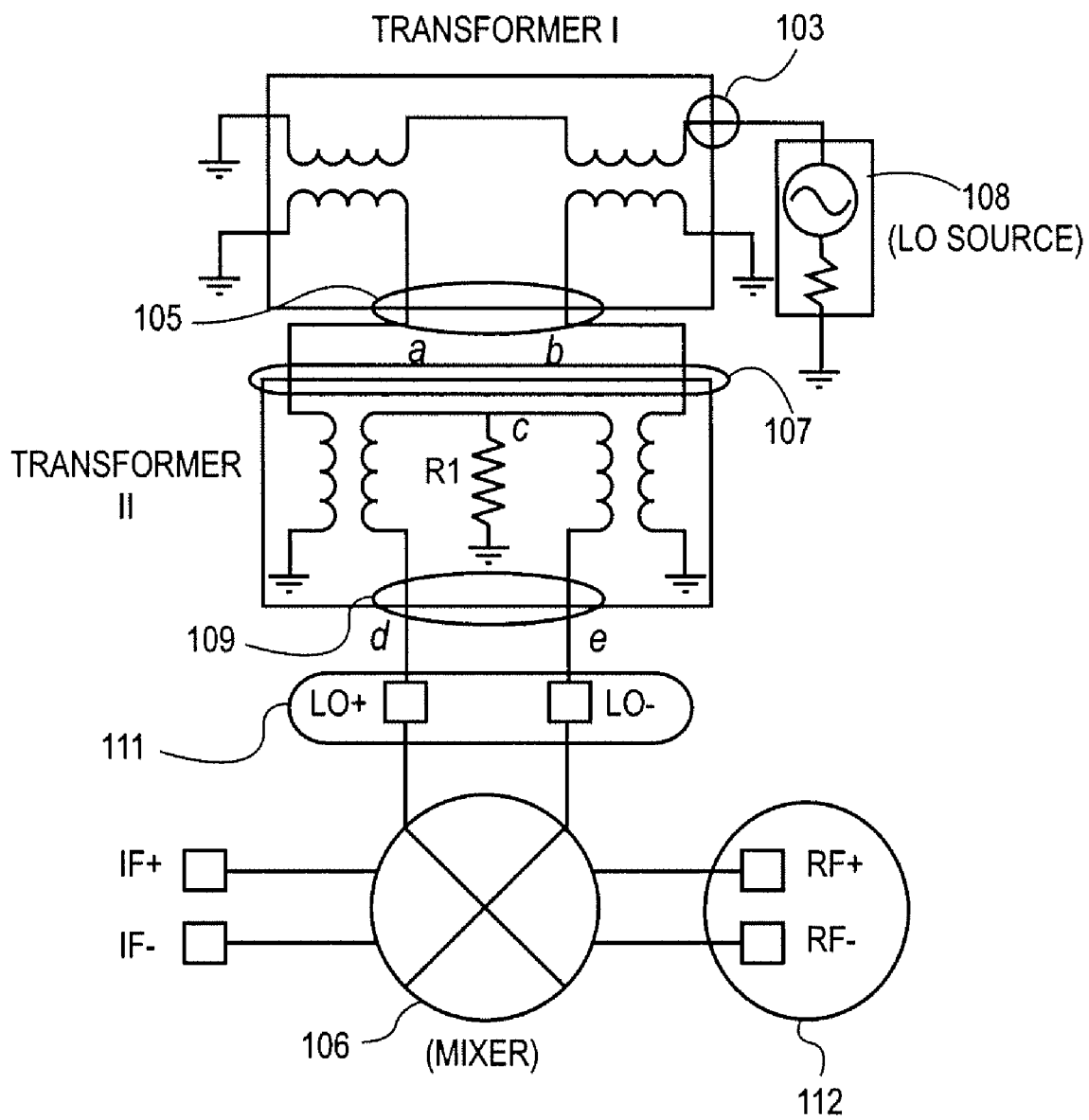
FIG. 3 is a block diagram of a circuit with dual transformers at the balanced LO input of a mixer.

FIG. 1 is a block diagram of an embodiment of the invention being an RF circuit that operates in the range of 1 GHz and above. All the components of the circuit may be implemented on the same microelectronic die (chip), as a monolithic circuit. Alternatively, the circuit may be implemented as a hybrid integrated circuit.

The circuit has two transformers, transformer 102 (transformer I) and transformer 104 (transformer II). Transformer 102 has a unbalanced input 103, also referred to as a single ended input, and a balanced output 105, also referred to as a differential output (with two terminals). Unless otherwise specified, the term "transformer" here refers to a device that transfers electrical energy from one circuit to another through inductively coupled wires. In addition to converting between unbalanced input impedance to balanced output impedance, the transformer I may or may not perform the additional functions that a classical transformer can perform, such as impedance absolute value transformation and DC electrical isolation between its "primary" and "secondary." Similarly, transformer II, which acts as a differential-to-differential coupler (differential coupler), may or may not perform those additional functions. Also, in the embodiments described further below, transformer I and transformer II each is made up of only passive devices, that is, there are no active devices such as diodes or transistors. In addition, each of the transformers I, II operate in relation to a circuit ground, which is another term for a power supply return node of a circuit. Each of the components depicted in FIG. 1 is expected to operate with reference to such a circuit ground as shown.

While transformer I has a single ended input, transformer II has a balanced input 107, as well as a balanced output 109. The balanced input 107 is coupled to the balanced output 105 of transformer I to receive the converted signal. This coupling may be a piece of transmission line that provides dc or conductive coupling, without any intermediary circuit components. Alternatively, the coupling may have one or more intermediate components as part of a transmission line network, e.g. one that acts as an impedance matching network that matches the output impedance of output 105 to the input impedance of input 107 and/or a dc blocking capacitor in series. The transformer II has a symmetrical structure about a center axis as shown, to provide its balanced input and a balanced output. For instance, one-half may be a mirror image of the other half across the center axis. Each half will contain one of the terminals of the input 107 and one of the terminals of the output 109.

The output 109 is coupled to a port 111 of a target circuit 106. The target circuit 106 is an active circuit whose impedance Ztarget has a substantial negative resistance component, Rtarget. An example is given below where the target circuit 106 is a balanced mixer. Alternatively, the target circuit could be a straight amplifier or other active circuit whose input impedance can create a resonance in the circuit loop that is formed with the output port of a transformer.

An impedance element 110 (also referring to as a stabilizing element) with a resistance component R1 is coupled to a circuit node of the transformer II at a point along the center axis. The impedance element 110 couples the circuit node to ground. In this embodiment, the impedance element 110 is dc coupled to the circuit node at one end and to ground at the other. In other embodiments, there may be intermediate components coupled between one end of the impedance element 110 and either the circuit node or ground, for various reasons. The impedance element 110 has a positive resistance component R1 (depicted by the resistor symbol in FIG. 1) that is greater than the absolute value of a negative resistance component of input impedance of the target circuit 106, over the frequency range of interests of the target circuit 106. Thus, if the impedance looking into the balanced port 111 of the target circuit 106 is represented as Ztarget=Rtarget+jXtarget, then R1>Rtarget. This constraint on R1 improves the stability of the target circuit 106 and, in particular, reduces the likelihood of common mode oscillation at the port 111. Note that the target circuit 106 has at least one other port 113 that may be either balanced or unbalanced.

In operation, the circuit of FIG. 1 causes a signal generated by the single-ended source 108 to be coupled into the unbalanced input port of transformer I. The latter acts as a balun, which converts the single-ended signal to differential form, at its output port 105, namely at terminals a and b. The balanced signal then drives transformer II through its balanced input 107. The transformer II acts as a differential coupler, and more accurately a differential coupler whose output port 109 provides an identical or scaled version of the differential signals at the two terminals of its input port 107. The output port 109 then drives the differential port 111 of the target circuit 106.

Coupling the impedance element 110 to a circuit node of the transformer II that lies along the center axis is particularly effective in the millimeter wave range of the frequency spectrum, that is above 30 GHz where parasitic effects are more significant and less predictable. Without the impedance element 110, and in particular one whose positive resistance component R1 has an absolute value that is larger than that of the negative resistance component of the input impedance of the differential port 111 of the target circuit 106, a resonance condition would occur in the circuit loop that includes the output port 109 and the port 111. This resonance can lead to spontaneous common mode oscillation in that circuit loop somewhere in the operating frequency range above 1 GHz, and more particularly in the millimeter wave range. The resistance component R1 helps dampen such oscillation, and its position, as coupled to the circuit node of transformer II along its center axis, will help maintain balance in the differential signal produced by the output of the transformer II.

Turning now to FIG. 2, another embodiment of the invention is depicted in block diagram form, where three transformers are provided at the balanced input of the target circuit 106. The transformers are connected in cascade beginning with transformer 102, transformer 104, and transformer 206 (transformer III), the latter having its balanced input coupled to the balanced output 109 of the second transformer 104. The transformer III has a symmetrical structure about a center axis and may be similar in structure to transformer II. In this embodiment, however, the stabilizing impedance element 110, rather than being coupled to transformer II, is coupled to a circuit node of transformer III (at a point along its center axis). This triple transformer architecture is believed to provide even greater "purity" in the differential signal that feeds into the port 111 of the target circuit 106. Conceptually, additional transformers may be added in this manner, in cascade, where the stabilizing impedance element 110 is coupled to the last transformer, that is, the one closest to the target circuit 106.

Turning now to FIG. 3, a block diagram of a circuit with dual transformers at the balanced LO input of a mixer (as the target circuit 106) is shown. Transformer I still acts as a balun and is driven by the signal source 108, referred to here as the LO source, at its single ended input port 103. Its output port 105 has terminals a and b, which are coupled to the balanced input port 107 of transformer II. Transformer II, acting as a differential coupler, comprises, in this case, of two identical or replicate sub-transformers that are configured in the manner shown in FIG. 3 on either side of a center axis, to yield an overall symmetrical configuration for transformer II. In this case, the center axis runs through the center of the stabilizing element containing R1, also referred here as a damping resistor, which connects the common circuit node c of the two sub-transformers to ac ground. The arrangement of the replicate sub-transformers in transformer II is such that its balanced output is formed by terminal d being the terminal of the secondary of one sub-transformer, and terminal e being the terminal of the secondary of the other sub-transformer. As depicted in FIG. 3, the two sub-transformers are mirror images of each other across the center axis that runs through R1. The other terminals of the secondaries of the sub-transformers are coupled to each other at the common node c to which R1 is, in this embodiment, conductively coupled. The other end of R1 is conductively coupled to ac ground. One terminal from the primary of each of the sub-transformers is coupled to ac ground, and the other terminals from the two primaries become the two terminals, respectively, of the balanced input port 107.

Due to the symmetry, node c in transformer II is a virtual ground seen by the differential signals at nodes a and b. Therefore, essentially no differential signal power is consumed by R1. In other words, R1 may conduct a current produced by common mode signal (e.g., common mode noise coming out of the mixer LO port 111 into transformer II is dissipated in R1), but essentially no current produced by differential signal. In one embodiment, the common mode current through R1 is the sum of the common mode noise currents that appear in the LO+ and LO− terminals of the mixer's input port 111. The signals at terminals d and e remain differential, as well. By this means, common mode oscillation at the LO port 111 of the mixer is prevented, without affecting the balance of the differential LO signal that is fed to it by transformer II.

Note that the mixer also has a further input port, if acting as an up conversion device, referred to as the IF port (terminals IF+ and IF−) and an RF port 112 (comprising terminals RF+ and RF−). The mixer may alternatively behave as a down conversion device where in that case the RF port 112 is deemed an input port, and the IF port is deemed an output port. Note that the use of "IF" here in labeling the third port of a mixer is not intended to be limited to mixers that convert to and from intermediate frequencies (which may be typically higher than base based frequencies). References to an "IF" port or terminal here also encompasses the third port of direct conversion mixers that convert directly to and from base band.

Figure 4:
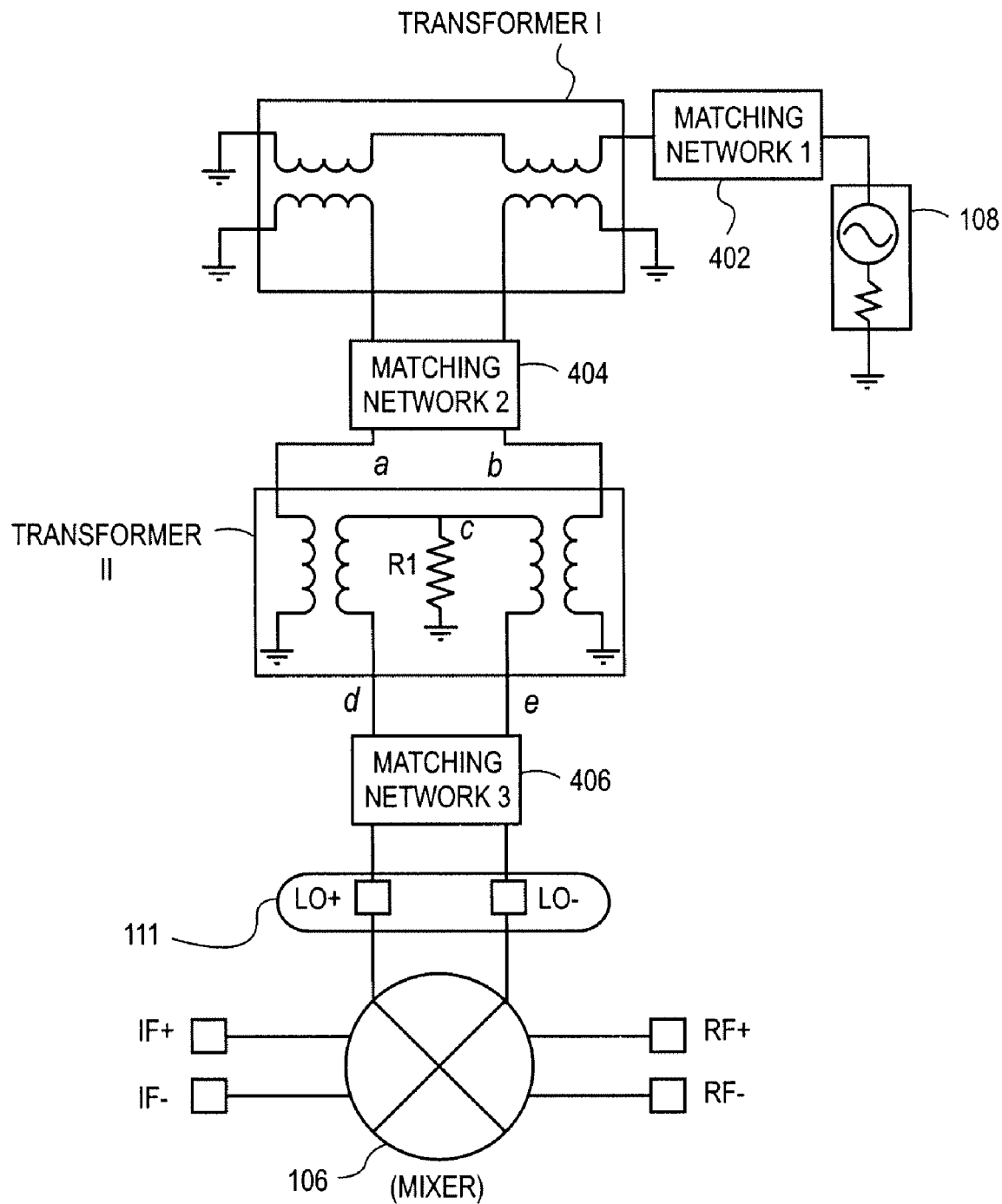
FIG. 4 shows impedance matching networks inserted between different coupled components of the circuit of FIG. 3.

In the embodiments of the invention described above in FIGS. 1-3, the drawings show the different components including transformers I-III, RF signal source 108, and target circuit 106 as being directly coupled to an adjacent component by a short piece of transmission line. In most practical circuits, some form of impedance matching network may need to be inserted between two adjacent RF components. Such an embodiment is depicted in FIG. 4. FIG. 4 shows a block diagram of essentially the circuit of FIG. 3, with matching networks 402, 404 and 406 inserted between their respective pairs of components. At microwave and higher operating frequencies, the matching network 402, 404 or 406 may include shorted or open stubs, transmission lines, coupled lines, as well as perhaps lumped circuit elements, such as inductors and capacitors. Inserting tuned impedance matching networks between the different components as shown, helps achieve as close to a maximum power transfer as practicable, between the signal source 108 and the target circuit 106. If the matching networks, as well as transformers I-III, are lossless, essentially all of the available power from the signal source 108 may be delivered into the port 111 of the target circuit 106.

Figure 5:
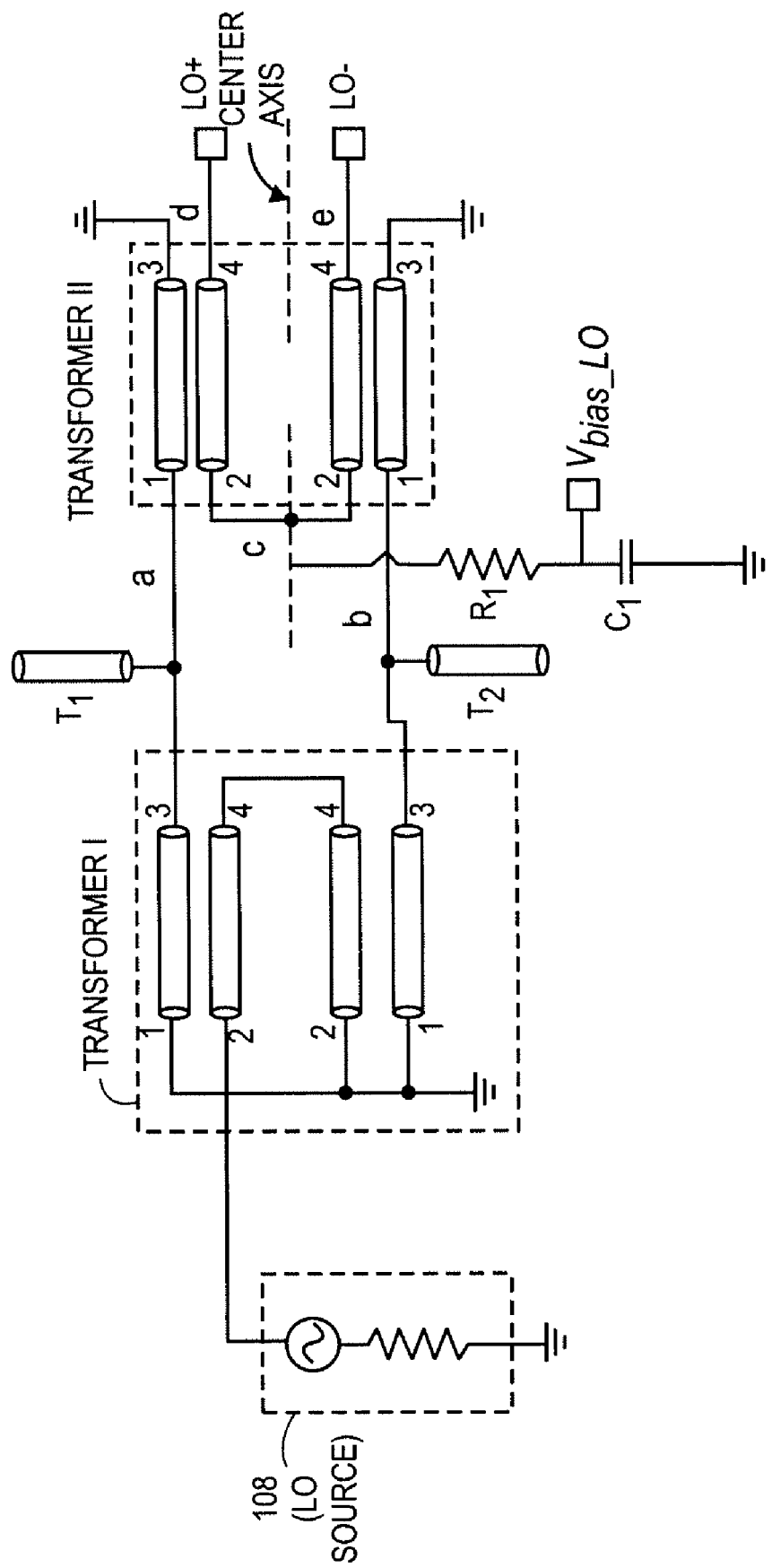
FIG. 5 is a block diagram of a circuit adapted to operate at frequencies above 30 GHz in which the dual transformers are implemented using coupled lines.

Turning now to FIG. 5, a block diagram of a circuit adapted to operate at frequencies above 30 GHz (that is, millimeter wave) in which the dual transformers are differential couplers that are implemented using coupled lines, is shown. This example enhances the performance and robustness of an up-conversion mixer whose components are integrated all on the same chip (though other types of active circuits can similarly be enhanced). FIG. 6 shows a double balanced Gilbert-type mixer using insulated gate field effect transistors such as those that are available in a suitable, short channel (e.g., 0.13 micron and smaller), complementary metal oxide semiconductor (CMOS) chip fabrication process. FIG. 5 shows an essentially passive network that delivers a differential LO signal (from signal source 108, in this embodiment also referred to as the LO source) to the LO port of the mixer. Transformer I has two pairs of co-planar coupled lines. Each coupled line pair has four ends, labeled 1-4 as shown. The co-planar coupled line pairs may be made using top-layer metal in a semiconductor fabrication process, e.g. a CMOS process, on the same chip as the other components shown. A top view of the co-planar coupled line pair is given in FIG. 7. This is an example of a waveguiding structure that is made of parallel, conductor strips or films on the same side of an insulator (e.g., dielectric) layer. In the coplanar waveguide structure, the signal carrying conductors (having ends 1-4 labeled as shown in FIG. 7) are laid out between a pair of ground strips. Other ways of implementing the coupled line pair are possible.

Still referring to FIG. 5, note how transformer II has a symmetrical structure about its center axis, where ends 2 and 4 of one sub-transformer are aligned with ends 2 and 4 of the other sub-transformer, i.e. the corresponding lines having ends 2 and 4 of each sub-transformer are replicates. Similarly, the corresponding lines having ends 1 and 3 are also aligned across the center axis and have similar dimensions. Transformer II may be built using two pairs of co-planar coupled lines, e.g. each being a replicate of the structure depicted in FIG. 7. To form the transformer II, one line of a first coupled line pair (e.g., the top pair shown in FIG. 5) has its end 1 coupled to one of the transmission lines of transformer I that defines its balanced output port. Transformer II has a second coupled line pair (e.g., the bottom pair depicted in FIG. 5) of which end 1 is coupled to the other one of the transmission lines that define the output port of transformer I. Still referring to transformer II, end 2 of the other line of each coupled line pair is coupled to a virtual ground node (circuit node c). End 4 of each coupled line pair becomes a respective one-half of a differential output of the circuit (in this case, coupled to the LO port of the mixer).

The impedance element R1 has one end coupled to the virtual ground node (circuit node c) and another end coupled to ac ground. R1 may be a lumped resistor whose resistance is selected as defined above (i.e., based on the resistance component of the input impedance of the port of the target circuit which transformer II will drive).

In addition, FIG. 5 shows the use of open stubs $T_1$ and $T_2$, each being conductively coupled to its respective circuit node between a transmission line 1-3 of transformer I and transmission line 1-3 of transformer II. The stubs are tuned in shape and length to form the impedance matching network 404 (see FIG. 4) between transformer I and transformer II. The open stubs $T_1$ and $T_2$ may be implemented as co-planar waveguide structures on the same side of an insulator layer, as depicted, for example, in FIG. 8. FIG. 8 shows a top view of a single stub, formed as a conductive strip that is equidistant from adjacent, conductive ground strips on either side of it.

Note that in this embodiment, R1 is coupled to ac ground via a series capacitor C1. This arrangement allows a dc bias generator circuit (not shown) to be coupled to the circuit node that is common to R1 and C1 as illustrated in FIG. 5. The dc bias generator is represented by Vbias_LO, referring to the bias voltage applied to the LO port to suitably bias to a desired dc level any transistors that are at the LO port (e.g., transistors M3, M4, M5 and M6 in FIG. 6). The capacitance of C1 should be large enough to act as an essential short within the range of frequencies of interest, namely the range of frequencies for any non-negligible common mode signals at the terminals of the LO port.

Figure 9:
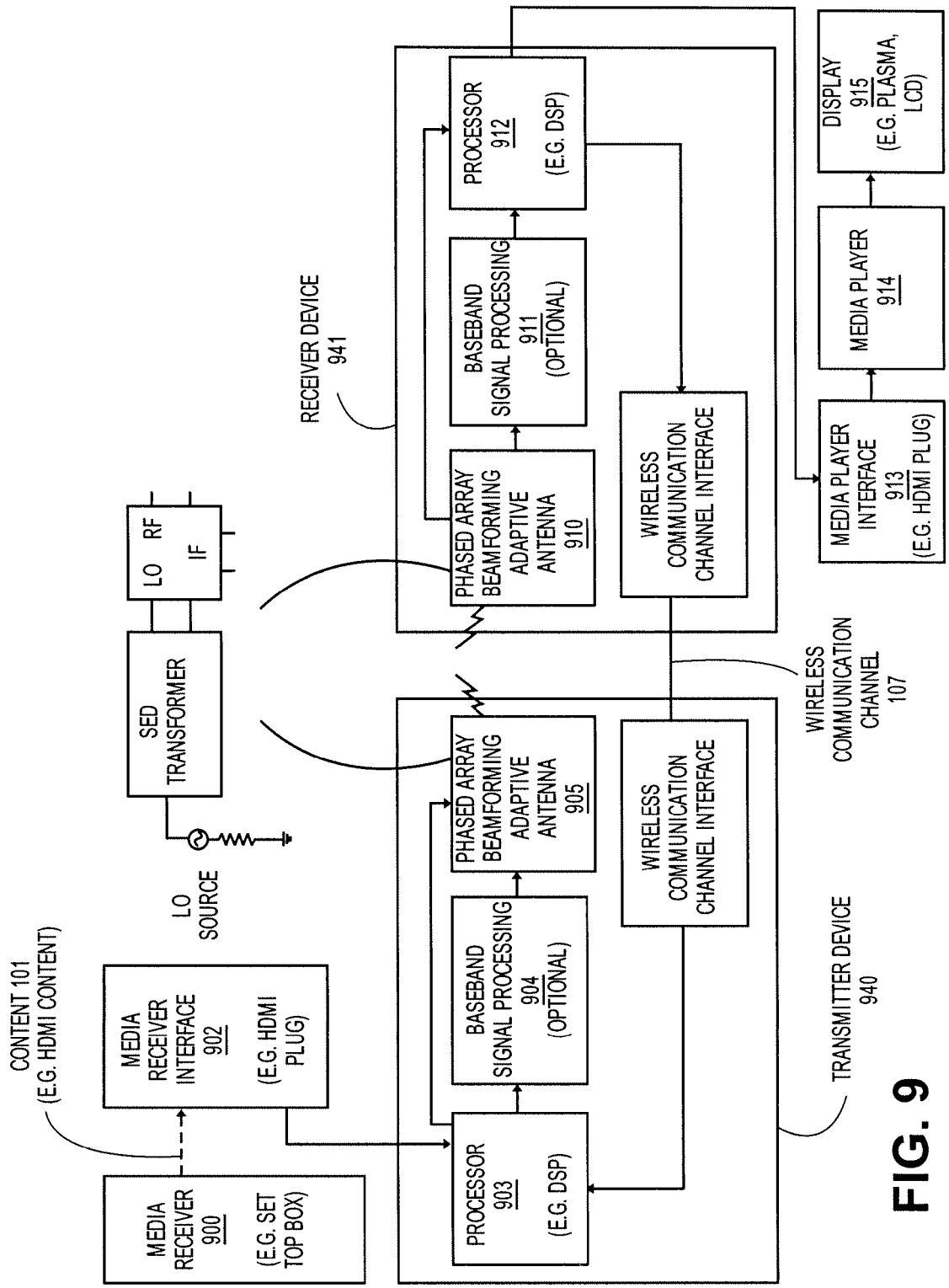
FIG. 9 is a block diagram of a system application of the various embodiments of the invention.

Referring to FIG. 9, a block diagram of a system application of an embodiment of the invention is shown. The wireless communication system shown has a transmitter device 940 with an adaptive beam forming antenna means 905. The antenna means implements a wireless content link to transfer content 901, such as streaming digital audio and/or video, to a receiver device 941. In addition, a separate wired or wireless link (e.g., wireless communication channel 907, also referred to as the side or back link) is provided, to send antenna information. This antenna information is sent back from the receiver device 941 to the transmitter device 940, to enable the transmitter to adapt its antenna array 905 by steering the antenna elements to operate in another direction, for example to avoid obstacles that have appeared between the transmitter and the receiver. The back link may also be used to transfer content protection information, such as encryption keys and acknowledgements of encryption keys, for use in playback of the content received at the receiving device 941. The content link may be in the 60 GHz band, whereas the back link may be in another wireless band, e.g. 2.4 GHz band.

Still referring to FIG. 9, the system has a media receiver 900 that receives digital audio and/or video content from a source, such as a cable television company's cable transmitter or a satellite television provider's satellite. The media receiver 900 may be a set top box. The content 901 may comprise base band digital video such as content adhering to HDMI or DVI standards. In that case, the media receiver 900 may include an HDMI transmitter to forward the received content. The media receiver sends its content to the transmitter device 940 via a media receiver interface 902. The interface 902 may include logic that converts content into HDMI content. It thus may comprise an HDMI plug, for instance, and in that case the content is sent via a wired connection. Alternatively, the transfer could occur through a wireless connection. In other embodiments, the content comprises DVI content.

As introduced above, transmitter device 940 wirelessly transfers information to the receiver device 941 using two wireless channels. One of the channels is through a phased array antenna with adaptive beam forming (content channel). The other, in this embodiment, is via wireless communications channel 907, also referred to here as the back channel or side channel. Receiver device 941 transfers the content received from transmitter device 940 to a media player 914, via a media player interface 913. This transfer may occur through a wired or wireless connection. For instance, the media player interface 913 may comprise an HDMI plug. Media player 914 causes the content to be played on an audio/video display 915, such as an LCD flat panel television display. The media player 914 may be a DVD player/recorder that can play and/or record the content being received from the transmitter device 940.

The transmitter device 940 comprises a processor 903, an optional base band processing component 904, and the phased array antenna means 905. An embodiment of the invention as described in connection with FIGS. 1-5 may be implemented within the antenna means 905, as follows. An antenna array may be coupled to the RF port of a mixer. A single ended to differential (SED) transformer circuit may be provided on-chip with the mixer. The SED circuit converts a single ended LO source signal into differential form, which is fed into the LO port of the mixer, using a cascade of two or more transformers that are as described above in connection with FIGS. 1-5. In general, the SED circuit introduces some positive, real resistance to the transformer that is closest to the port of the mixer (or other active circuit that is to be stabilized). This may help avoid common mode oscillation at that port when that port is differentially quiescent, e.g. when there is no LO signal. The SED circuit achieves this while maintaining a very balanced signal into the port. The SED circuit and mixer may be adapted to operate in the millimeter wave (mmw) range, i.e. above 30 GHz, with the beam forming antenna also being adapted to operate in the mmw range.

Still referring to FIG. 9, the antenna means 905 has a digitally controlled phased array antenna that is coupled to and controlled by the processor 903, to transmit content to the receiver device 941 using adaptive beam forming. A similar arrangement is also present in the receiver device 941 to receive content from the transmitter device 940 using adaptive beam forming.

In one embodiment, processor 903 generates base band signals that are processed by base band signal processor 904 prior to being wirelessly transmitted by the antenna means 905. In such a case, the receiver device 941 also includes base band signal processing to convert analog signals received by the antenna means 910 into base band signals for processing by processor 912. For instance, the base band signals may be orthogonal frequency division multiplexed (OFDM) signals.

During initialization of the antennas 905 and 910, the wireless communication link 907 is used to send information that enables processor 903 to select a direction to transmit. This information may include antenna location and antenna performance for that antenna location, which is sent by the processor 912 to the processor 903 to enable the latter to determine which direction to transmit the content. Further details concerning the system of FIG. 9 can be found in U.S. Patent Application Publication No. 2007/0037528. Other system applications of the SED circuit with multiple transformers include military wireless communications systems.

The invention is not limited to the specific embodiments described above. For example, in the examples given above in FIGS. 7 and 8, the coupled line pair and the transmission line used to implement the various embodiments of the invention are made using co-planar waveguide. As an alternative, other embodiments of the invention may use other types of waveguiding structures in which the conductors (e.g., metal strips or films) are on the same side of a dielectric layer, e.g. slotline, co-planer strips, and microstrip. One or more of these may be selected as alternatives, if allowed by the fabrication process and if they meet the desired functions within the frequency range of operation. Also, although an advanced yet standard CMOS process may be desirable in most instances, an embodiment of the invention may also be implemented by other microelectronic fabrication processes, including for example a 0.18 micron, SiGe bipolar CMOS process. Accordingly, such other embodiments may be within the scope of the claims.

What is claimed is:

1. A circuit comprising:
   a balun having an unbalanced input and a balanced output;
   a differential coupler having a symmetrical structure about a center axis including first and second transformers that are replicates and that are positioned on opposite sides of the center axis, the differential coupler having a differential input and a differential output, the differential input being coupled to the balanced output of the balun; and
   an impedance element coupled to a circuit node of the differential coupler at a point along the center axis said circuit node being common to the first and second transformers, wherein the impedance element couples said circuit node to AC ground for the circuit.

2. The circuit of claim 1 further comprising:
   an active circuit having a differential input coupled to the differential output of the coupler, wherein impedance looking into the differential input of the active circuit has a negative resistance component over a frequency range of operation,
   and wherein the impedance element has a positive resistance component that is greater than the absolute value of the negative resistance component somewhere in said frequency range of operation.

3. The circuit of claim 2 wherein the frequency range of operation is somewhere between 46 GHz and 52 GHz.

4. The circuit of claim 2 further comprising an impedance matching network coupled between the differential output of the differential coupler and the differential input of the active circuit.

5. The circuit of claim 2 further comprising an impedance matching network coupled between the balanced output of the balun and the differential input of the differential coupler.

6. The circuit of claim 2 wherein the active circuit comprises a mixer, and the differential input of the active circuit is a local oscillator port of the mixer.

7. The circuit of claim 2 wherein the balun and the differential coupler are adapted to operate above 1 GHz.

8. The circuit of claim 1 further comprising:
a capacitor coupled in series with the impedance element; and
a DC bias generator circuit coupled to a node that is common to the impedance element and the capacitor.

9. A circuit comprising:
a balun having a pair of transmission lines that make up its differential output;
a first coupled line pair one line of which has one end conductively coupled to one of the transmission lines of the balun;
a second coupled line pair one line of which has one end conductively coupled to the other one of the transmission lines of the balun, the first and second coupled line pairs forming a symmetrical structure about a center axis;
the other line of the first pair has one end coupled to a node and another end being one half of a differential output of the circuit;
the other line of the second pair has one end that is coupled to the node that is on the center axis, and another end being the other half of the differential output of the circuit; and an impedance element having one end coupled to the node and another end coupled to AC ground of the circuit.

10. The circuit of claim 9 wherein the impedance element is a lumped resistor.

11. The circuit of claim 9 wherein the impedance element couples the node to ac ground somewhere in the range 10 GHz-100 GHz.

12. The circuit of claim 9 wherein the balun and the first and second coupled line pairs are adapted to operate above 30 GHz.

13. The circuit of claim 9 further comprising:
a capacitor coupled in series with the impedance element; and
a DC bias generator circuit coupled to a node that is common to the impedance element and the capacitor.

14. A circuit comprising:
a first transformer having an unbalanced input and a balanced output;
a second transformer having a balanced input coupled to the balanced output of the first transformer, the second transformer having a symmetrical structure about a center axis and a balanced output;
an impedance element having one end coupled to a circuit node of the second transformer at a point along the center axis and another end coupled to ground; and
a target circuit having a balanced input coupled to the balanced output of the second transformer.

15. The circuit of claim 14 wherein
the impedance element has a resistive component that is greater than the absolute value of a negative resistive component of input impedance of the target circuit somewhere in a frequency range.

16. The circuit of claim 15 wherein the frequency range is above 30 GHz.

17. The circuit of claim 14 further comprising:
a third transformer coupled between the first transformer and the second transformer, so that its balanced input is coupled to the balanced output of the first transformer and its balanced output is coupled to the balanced input of the second transformer.

18. The circuit of claim 17 wherein
the impedance element has a resistive component that is greater than the absolute value of a negative resistive component of input impedance of the target circuit somewhere in a frequency range.

19. The circuit of claim 18 wherein the frequency range is above 30 GHz.

20. An electronic system comprising:
a millimeter wave beam forming antenna array circuit having
a mixer with an RF port coupled to an antenna array, and
a single-ended to differential transformer circuit having
a balun with an unbalanced input and a balanced output adapted to operate somewhere in the range 45 GHz-66 GHz, a differential coupler with a symmetrical structure about a center axis and that contains first and second transformers which are replicates and that are positioned on opposite sides of the center axis, the differential coupler having a differential input and a differential output, the differential input being coupled to the balanced output of the balun, the differential output being coupled to an LO input of the mixer, and an impedance element coupled to a circuit node of the differential coupler that is common to the first and second transformers, wherein the impedance element couples said circuit node to ac ground.

21. The system of claim 20 wherein the mixer and single-ended to differential transformer circuit are integrated in a CMOS-processed chip.

22. The system of claim 21 in combination with a consumer product grade audio and/or video digital media receiver, wherein the mixer is an up-conversion device that receives an audio and video stream from the media receiver and transfers the stream to higher frequencies for transmission by the antenna array.

23. The system of claim 21 in combination with a consumer product grade audio and/or video digital media player, wherein the mixer is a down-conversion device that is to transfer an audio and/or video stream received by the antenna array to lower frequencies and sends the audio and/or video stream to the media player for playback.

24. A circuit comprising:
a balun having an unbalanced input and a balanced output;
a differential coupler having a symmetrical structure about a center axis, the differential coupler having a differential input and a differential output, the differential input being coupled to the balanced output of the balun;
an impedance element coupled to a circuit node of the differential coupler at a point along the center axis;
an active circuit having a differential input coupled to the differential output of the coupler, wherein impedance looking into the differential input of the active circuit has a negative resistance component over a frequency range of operation,
and wherein the impedance element has a positive resistance component that is greater than the absolute value of the negative resistance component somewhere in said frequency range of operation.

25. The circuit of claim 24 wherein the frequency range of operation is somewhere between 46 GHz and 52 GHz.

26. The circuit of claim 24 wherein the active circuit comprises a mixer, and the differential input of the active circuit is a local oscillator port of the mixer.

27. The circuit of claim 24 further comprising:
a capacitor coupled in series with the impedance element; and
a DC bias generator circuit coupled to a node that is common to the impedance element and the capacitor.

28. A circuit comprising:
a first transformer having an unbalanced input and a balanced output;
a second transformer having a balanced input coupled to the balanced output of the first transformer, the second transformer having a symmetrical structure about a center axis and a balanced output;
an impedance element having one end coupled to a circuit node of the second transformer at a point along the center axis and another end coupled to ground; and
a target circuit having a balanced input coupled to the balanced output of the second transformer, wherein the impedance element has a resistive component that is greater than the absolute value of a negative resistive component of input impedance of the target circuit somewhere in a frequency range.

29. The circuit of claim 28 wherein the frequency range is above 30 GHz.

30. The circuit of claim 28 further comprising:
a third transformer coupled between the first transformer and the second transformer, so that its balanced input is coupled to the balanced output of the first transformer and its balanced output is coupled to the balanced input of the second transformer.

* * * * *